United States Patent
Smadi et al.

(10) Patent No.: US 8,571,595 B2
(45) Date of Patent: Oct. 29, 2013

(54) METHOD AND SYSTEM FOR ADJUSTING WLAN RADIO RECEIVER GAIN IN A WIRELESS DEVICE

(75) Inventors: Mohammed Nawaf Smadi, Ancaster (CA); Vytautas Robertas Kezys, Hamilton (CA)

(73) Assignee: BlackBerry Limited, Waterloo, Ontario (CA)

( * ) Notice: Subject to any disclaimer, the term of this patent is extended or adjusted under 35 U.S.C. 154(b) by 240 days.

(21) Appl. No.: 13/081,712

(22) Filed: Apr. 7, 2011

(65) Prior Publication Data

US 2012/0258759 A1    Oct. 11, 2012

(51) Int. Cl.
  *H04B 7/00* (2006.01)
  *H04B 3/46* (2006.01)
  *H04B 17/00* (2006.01)
  *H04B 7/185* (2006.01)
  *H04Q 1/20* (2006.01)

(52) U.S. Cl.
  USPC ........... 455/522; 455/41.2; 375/227; 370/318

(58) Field of Classification Search
  USPC ........... 455/41.2, 501, 522, 63.1, 67.1, 67.13, 455/69; 375/227; 370/318
  See application file for complete search history.

(56) References Cited

U.S. PATENT DOCUMENTS

| | | | |
|---|---|---|---|
| 5,772,061 A | 6/1998 | Lowe | |
| 7,054,605 B1 * | 5/2006 | Groe | 455/254 |
| 7,424,268 B2 | 9/2008 | Diener et al. | |
| 7,688,784 B2 | 3/2010 | Bitran et al. | |
| 7,755,523 B2 * | 7/2010 | Hwang et al. | 341/139 |
| 7,778,603 B2 | 8/2010 | Palin et al. | |
| 2001/0029172 A1 * | 10/2001 | Lee et al. | 455/234.1 |
| 2003/0181180 A1 | 9/2003 | Darabi et al. | |
| 2004/0152429 A1 * | 8/2004 | Haub et al. | 455/102 |
| 2004/0192222 A1 | 9/2004 | Vaisanen et al. | |
| 2008/0291983 A1 | 11/2008 | Myers | |
| 2008/0318630 A1 | 12/2008 | Gil | |
| 2009/0239471 A1 | 9/2009 | Tran et al. | |
| 2009/0257379 A1 | 10/2009 | Robinson et al. | |
| 2009/0323652 A1 | 12/2009 | Chen et al. | |
| 2010/0014875 A1 * | 1/2010 | Uto | 398/202 |
| 2010/0029204 A1 | 2/2010 | Gao et al. | |

(Continued)

FOREIGN PATENT DOCUMENTS

| WO | WO 01/06669 A1 | 1/2001 |
|---|---|---|
| WO | WO 2010/014806 A1 | 2/2010 |

OTHER PUBLICATIONS

European Patent Office, Extended European Search Report for European Patent Application No. 11161581.1, Sep. 14, 2011.

*Primary Examiner* — Andrew Wendell
(74) *Attorney, Agent, or Firm* — McCarthy Tétrault LLP

(57) ABSTRACT

A method for adjusting a gain level for a receiver of a first radio simultaneously operational with a transmitter of a second radio, comprising: determining a signal-to-noise ratio ("SNR") value for signals received by the receiver from an access point ("AP"); and, when the first radio is associated with the AP and the transmitter is not transmitting, if the SNR value exceeds a SNR threshold, reducing the gain level for the receiver from an initial level and initiating transmission from the transmitter, otherwise maintaining the gain level for the receiver at the initial level and initiating transmission from the transmitter; wherein the SNR threshold is a SNR value above which beacon signals from the AP can be successfully received by the receiver.

22 Claims, 5 Drawing Sheets

(56) References Cited

U.S. PATENT DOCUMENTS

| | | |
|---|---|---|
| 2010/0046679 A1* | 2/2010 | Kajakine et al. .............. 375/345 |
| 2010/0091670 A1 | 4/2010 | Uln et al. |
| 2010/0173599 A1* | 7/2010 | Solum ........................ 455/232.1 |
| 2010/0316027 A1 | 12/2010 | Rick et al. |
| 2012/0028594 A1* | 2/2012 | Rao et al. ....................... 455/207 |

* cited by examiner

METHOD AND SYSTEM FOR ADJUSTING WLAN RADIO RECEIVER GAIN IN A WIRELESS DEVICE

FIELD OF THE APPLICATION

This application relates to the field of wireless devices, and more specifically, to a method and system for adjusting receiver gain in a wireless local area network ("WLAN") radio of a wireless device supporting simultaneous WLAN and Bluetooth communications.

BACKGROUND

Current wireless mobile communication devices include microprocessors, memory, soundcards, speakers, headphones, and run one or more software applications in addition to providing for voice communications. Examples of software applications used in these wireless devices include browsers, address books, email, instant messaging ("IM"), and mobile hotspot functions. Additionally, wireless devices have access to a plurality of services via the Internet. A wireless device may, for example, be used to browse web sites on the Internet, to transmit and receive graphics, and to execute streaming audio and/or video applications. Such wireless devices may operate on a cellular network (e.g., GSM), on a wireless local area network ("WLAN") (e.g., IEEE 802.11), on a Bluetooth network (e.g., IEEE 802.15.1), or on all of these types of networks.

One problem with current wireless devices pertains to simultaneous WLAN and Bluetooth communications. During such communications, interference may arise between WLAN signal reception and Bluetooth signal (e.g., voice) transmission. In particular, the front-end radio frequency ("RF") architectures of some wireless devices allow for simultaneous Bluetooth and WLAN operation. An example of such an architecture is one where each of the WLAN and Bluetooth radios has its own antenna. Bluetooth includes adaptive frequency hopping ("AFH") functionality which reduces co-channel interference. However, during simultaneous Bluetooth transmission ("TX") and WLAN reception ("RX"), adjacent channel interference ("ACI") continues to be a serious problem. Reducing the Bluetooth TX power level and increasing the Bluetooth to WLAN antenna isolation can help in reducing ACI but it is often not helpful enough.

One key metric of WLAN receiver performance is automatic gain control ("AGC") which is used to regulate the received signal strength at the input of the analog-to-digital converter ("ADC") within the wireless device such that the required signal-to-noise ratio ("SNR") for proper decoding is met. In the presence of strong ACI, better performance is obtained by reducing the level of AGC. This however has the effect of reducing receiver sensitivity, that is, only WLAN frames with higher SNR values will be decoded correctly. This trade-off is not present in the absence of ACI and maintaining AGC at a high value is recommended for improved WLAN receiver performance.

A need therefore exists for an improved method and system for adjusting receiver gain in a WLAN radio of a wireless device supporting simultaneous WLAN and Bluetooth communications. Accordingly, a solution that addresses, at least in part, the above and other shortcomings is desired.

BRIEF DESCRIPTION OF THE DRAWINGS

Features and advantages of the embodiments of the present application will become apparent from the following detailed description, taken in combination with the appended drawings, in which.

It will be noted that throughout the appended drawings, like features are identified by like reference numerals.

DETAILED DESCRIPTION OF THE EMBODIMENTS

In the following description, details are set forth to provide an understanding of the application. In some instances, certain software, circuits, structures and techniques have not been described or shown in detail in order not to obscure the application. Example embodiments may be implemented in any computer programming language provided that the operating system of the device (e.g., wireless device, data processing system, etc.) provides the facilities that may support the requirements of the application. Any limitations presented would be a result of a particular type of operating system or computer programming language and would not be a limitation of the present application. Example embodiments of the present application may also be implemented in hardware or in a combination of hardware and software.

According to one embodiment of the application, there is provided a method for adjusting a gain level for a receiver of a first radio (e.g., a wireless local area network ("WLAN") radio) simultaneously operational with a transmitter of a second radio (e.g., a Bluetooth radio), comprising: determining a signal-to-noise ratio ("SNR") value for signals (e.g., WLAN signals) received by the receiver from an access point ("AP"); and, when the first radio is associated with the AP and the transmitter is not transmitting, if the SNR value exceeds a SNR threshold, reducing the gain level for the receiver from an initial level and initiating transmission from the transmitter, otherwise maintaining the gain level for the receiver at the initial level and initiating transmission from the transmitter; wherein the SNR threshold is a SNR value above which beacon signals (e.g., WLAN beacon signals) from the AP can be successfully received by the receiver.

Figure 1:
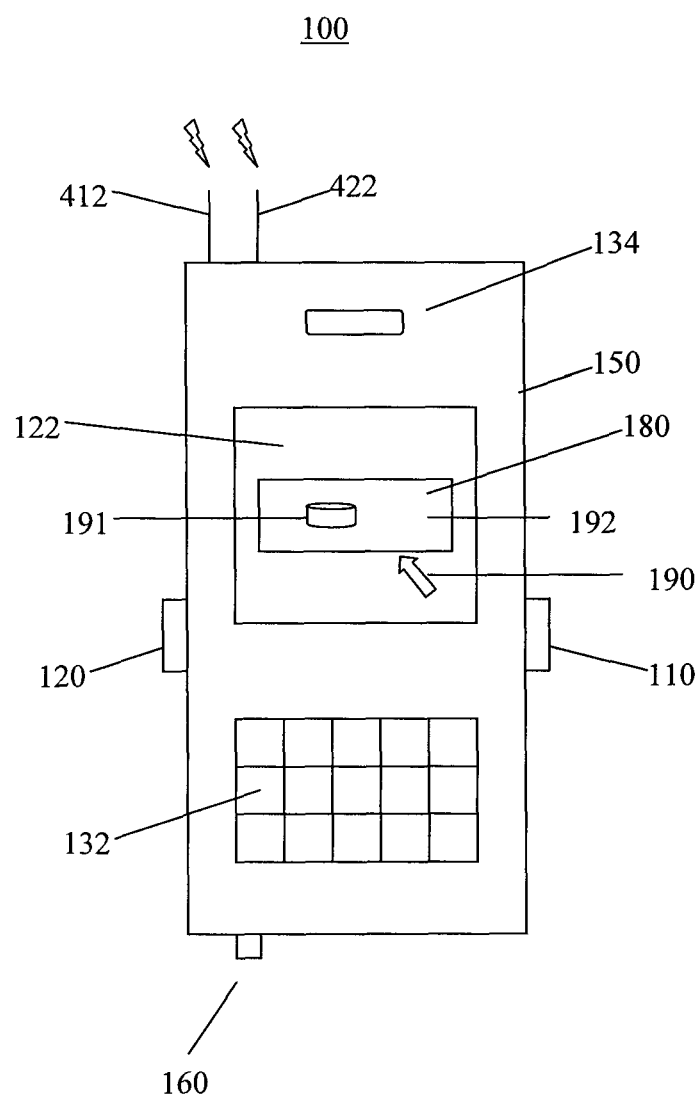
FIG. 1 is a front view illustrating a wireless device in accordance with an embodiment of the application.

FIG. 1 is a front view illustrating a wireless device 100 in accordance with an embodiment of the application. The wireless device 100 may include a cover or case 150, a display (e.g., a liquid crystal display ("LCD")) 122, a graphical user interface ("GUI") 180 displayed on the display 122, a speaker 134, a keyboard (or keypad) 132, a trackball or thumbwheel 110, various select buttons 120, and various inputs/outputs (e.g., power connector jack, data interface ports, headphones jack, etc.) 160. Internally, the wireless device 100 may include a central processing unit ("CPU"), processor, or microprocessor 138, memory 124, 126, 200, a battery 156, at least one antenna 412, 422, etc., which are operatively coupled to the various inputs/outputs 160, the keyboard 132, the display 122, the speaker 134, etc., as will be described below.

Figure 2:
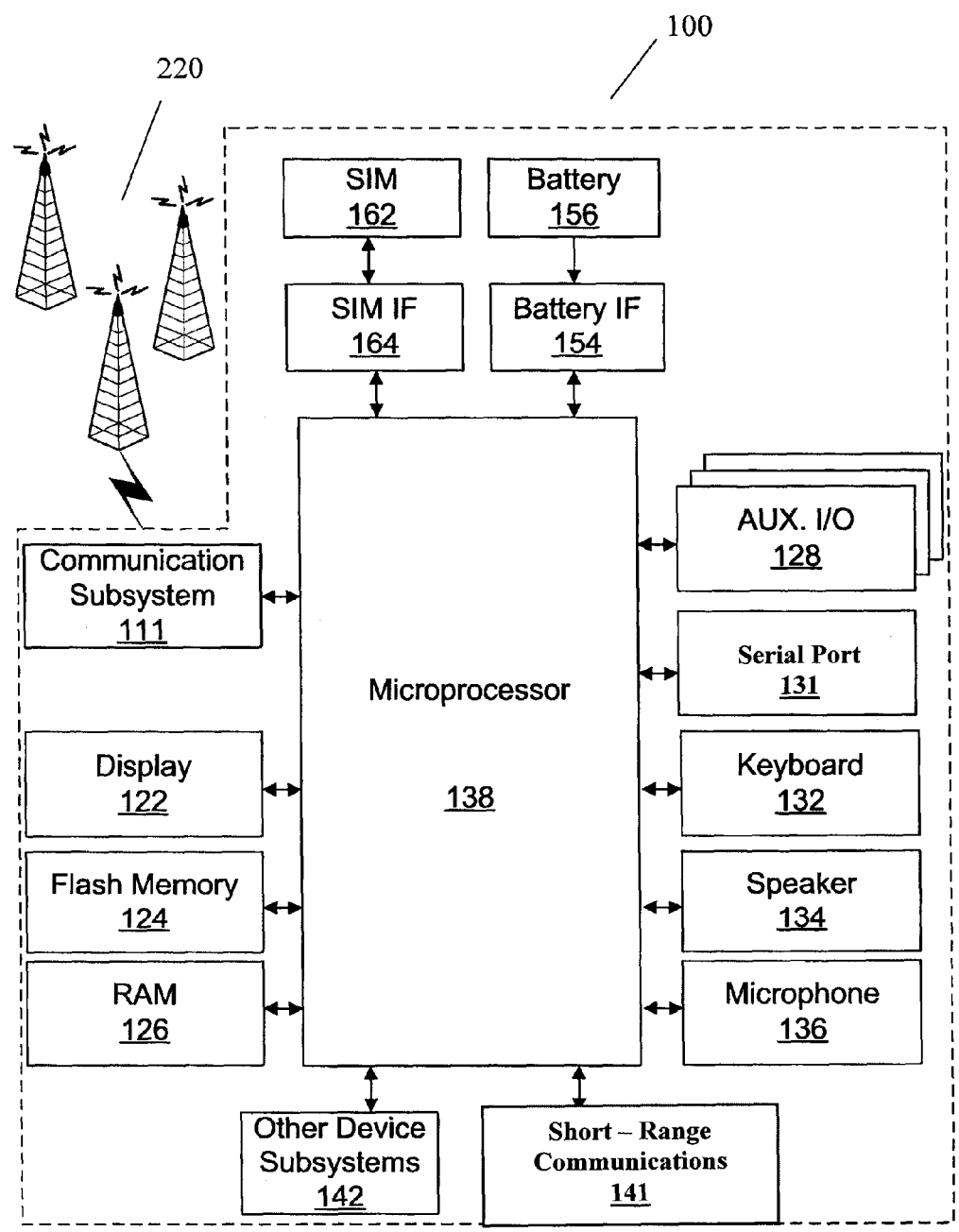
FIG. 2 is a block diagram illustrating the wireless device of FIG. 1.
Figure 4:
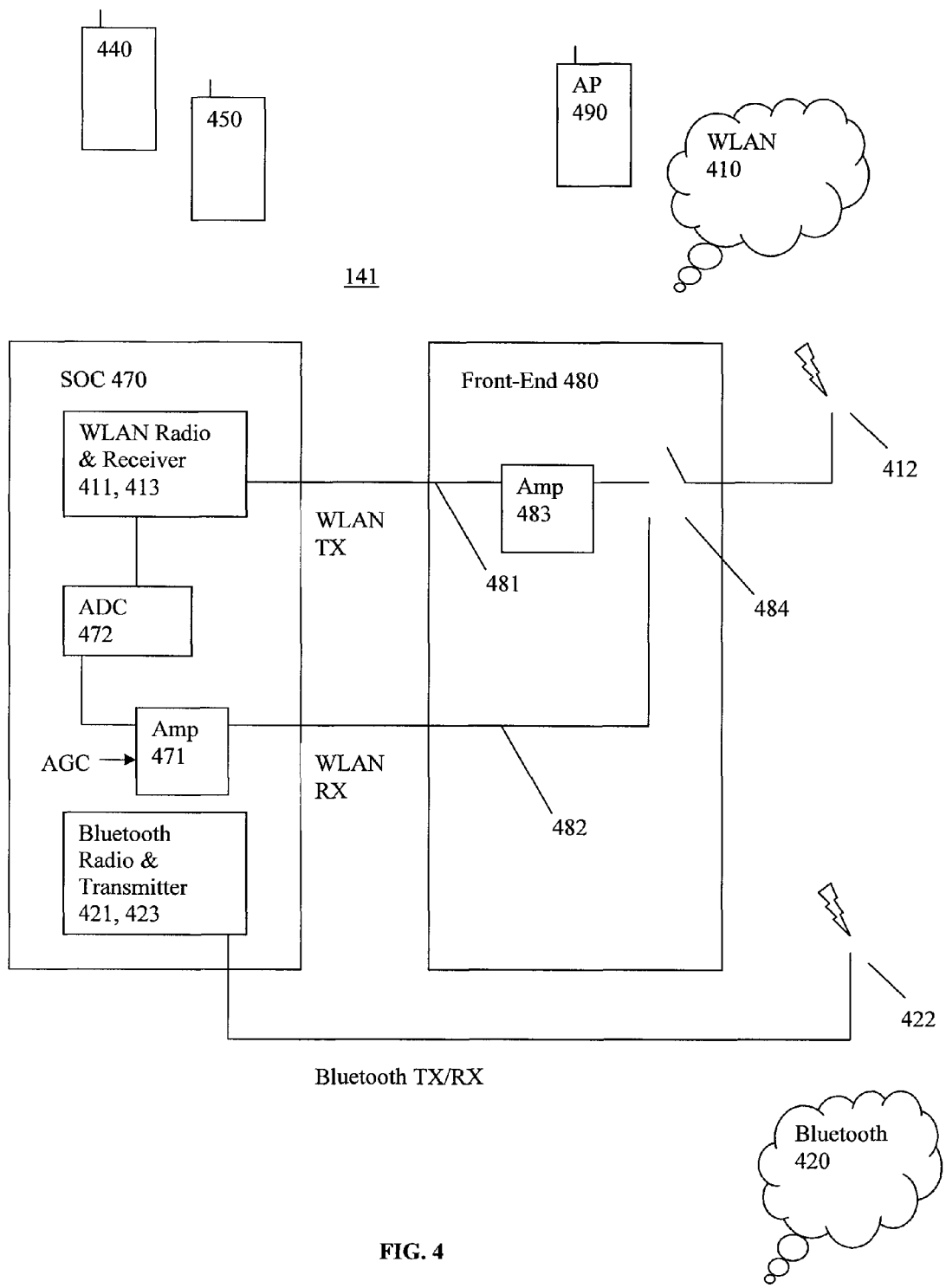
FIG. 4 is a block diagram illustrating a short-range communications subsystem of the wireless device of FIG. 1; and, FIG. 5 is a flow chart illustrating operations of modules within the memory of a wireless device for adjusting automatic gain control in the WLAN receiver of a wireless device during simultaneous WLAN and Bluetooth communications, in accordance with an embodiment of the application.

FIG. 2 is a block diagram illustrating the wireless device 100 of FIG. 1. The wireless device 100 may operate over a wireless network 220. The wireless network 220 may include antennae, base stations, access points ("APs"), transceivers, supporting radio equipment (e.g., a GSM radio, a Wi-Fi or WLAN radio 411, a Bluetooth radio 421 as shown in FIG. 4, etc.), etc., as known to those of ordinary skill in the art, for supporting wireless communications between the wireless device 100 and other devices (e.g., laptop computers 440, tablet computers 450, etc., as shown in FIG. 4). The wireless network 220 may include a cellular network (e.g., a global system for mobile communication ("GSM") network, a $3^{rd}$ generation partnership project ("3GPP") GSM network, a code division multiple access ("CDMA") network, etc.), a Wi-Fi network (i.e., a WLAN based on IEEE 802.11 standards) 410, and a Bluetooth network (i.e., a Bluetooth network based on IEEE 802.15.1 standards) 420 as shown in FIG. 4.

The wireless device 100 may be a two-way communication device having at least voice and advanced data communication capabilities, including the capability to communicate with other devices. Depending on the functionality provided by the device 100, it may be referred to as a data messaging device, a two-way pager, a cellular telephone with data messaging capabilities, a wireless Internet appliance, a data communication device (with or without telephony capabilities), a data processing system, a Wi-Fi device, a WLAN device, a dual-mode (i.e., Wi-Fi and cellular) device, a portable audio device, or a Bluetooth device. The device 100 may communicate with any one of a plurality of transceiver stations within its geographic coverage area.

The wireless device 100 may have a communication subsystem 111, a subscriber identity module (or "SIM" card) 162 for inserting into a SIM interface ("IF") 164 in order to operate on a cellular network (e.g., a global system for mobile communication ("GSM") network, a $3^{rd}$ generation partnership project ("3GPP") GSM network, etc.), a battery IF 154 for receiving one or more rechargeable batteries 156, a microprocessor 138 which controls overall operation of the device 100, a flash memory 124 or other persistent store, a random access memory ("RAM") 126, auxiliary input/output ("I/O") subsystems 128, a serial port (e.g., a universal serial bus ("USB") port) 131, a microphone 136, a short-range communications subsystem 141 (e.g., for WLAN and Bluetooth communications), and other device subsystems 142. The microprocessor 138, in addition to performing operating system functions, preferably enables execution of software applications on the device 100.

Figure 3:
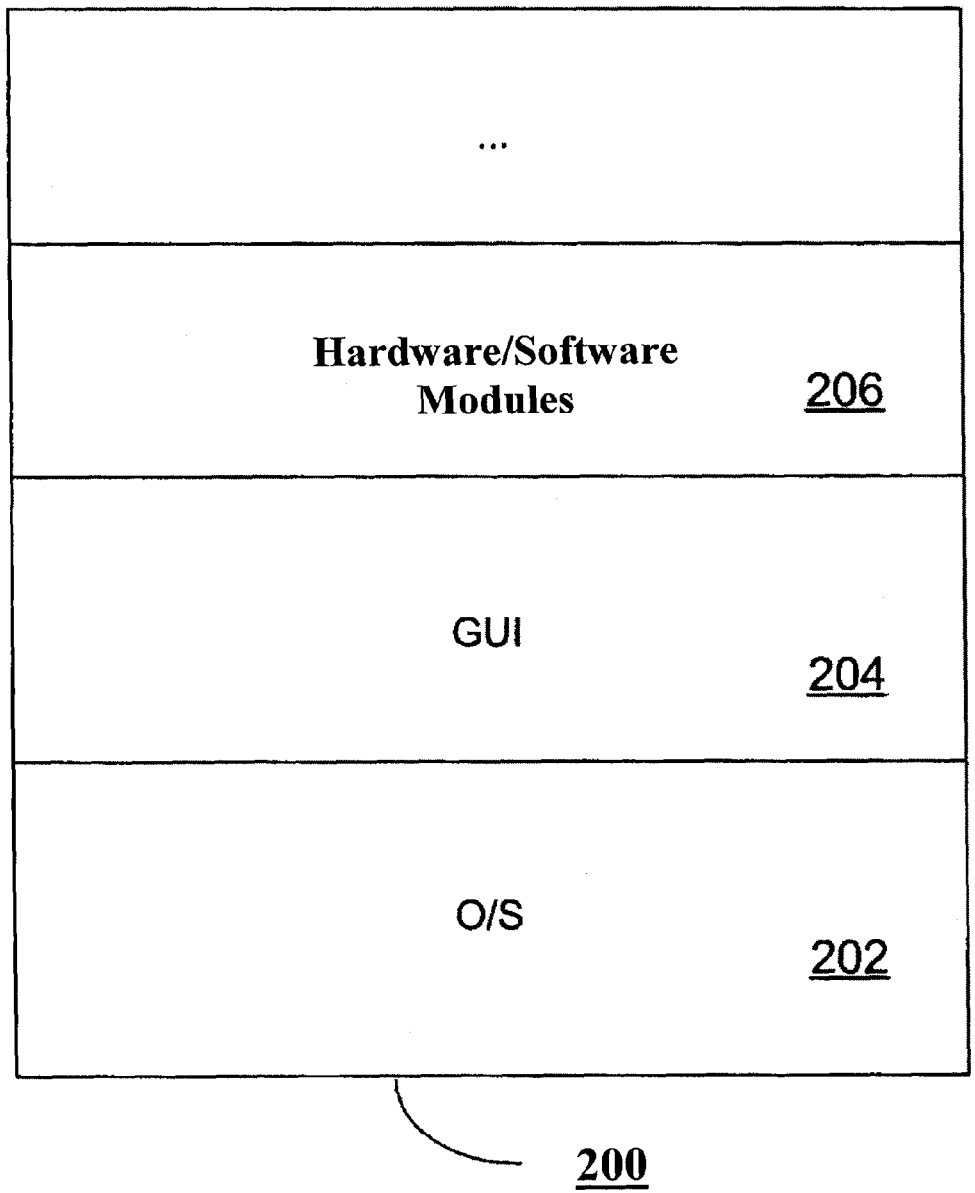
FIG. 3 is a block diagram illustrating a memory of the wireless device of FIG. 1.

FIG. 3 is a block diagram illustrating a memory 200 of the wireless device 100 of FIG. 1. The microprocessor 138 is coupled to the memory 200. The memory 200 has various hardware and software components for storing information (e.g., instructions, data, database tables, test parameters, etc.) for enabling operation of the device 100 and may include flash memory 124, RAM 126, ROM (e.g., 200), disk drives (e.g., 200), etc. In general, the memory 200 may include a variety of storage devices typically arranged in a hierarchy of storage as understood to those skilled in the art. To provide a user-friendly environment to control the operation of the device 100, operating system ("O/S") software modules 202 resident on the device 100 may provide a basic set of operations for supporting various applications typically operable through the GUI 180 and supporting GUI software modules 204. For example, the O/S 202 provides basic input/output system features to obtain input from the auxiliary I/O 128, the keyboard 132, the trackball or thumbwheel 110, and the like, and for facilitating output to the user through the display 122, the speaker 134, etc. According to one example embodiment, the wireless device 100 is provided with hardware and/or software modules 206 for facilitating and implementing the method of the application as will be described below. The wireless device 100 may be provided with additional hardware and/or software modules 206 for facilitating and implementing various functions (e.g., an AGC adjustment function 206 as described below).

A user may interact with the wireless device 100 and its various modules 202, 204, 206, using the GUI 180. GUIs are supported by common operating systems and provide a display format which enables a user to choose commands, execute application programs, manage computer files, and perform other functions by selecting pictorial representations known as icons, or items from a menu through use of an input or pointing device such as a trackball or thumbwheel 110 and keyboard 132. The GUI 180 may include a cursor 190, various selectable objects and icons 191, and various windows 192.

Thus, the wireless device 100 includes computer executable programmed instructions for directing the device 100 to implement the example embodiments of the present application. The programmed instructions may be embodied in one or more hardware or software modules 206 which may be resident in the memory 200 of the wireless device 100 or elsewhere. Alternatively, the programmed instructions may be embodied on a computer readable medium or product (such as a CD disk or floppy disk) which may be used for transporting the programmed instructions to the memory 200 of the wireless device 100. Alternatively, the programmed instructions may be embedded in a computer-readable signal or signal-bearing medium or product that may be uploaded to a network 220 by a vendor or supplier of the programmed instructions, and this signal or signal-bearing medium or product may be downloaded through an interface 111, 131, 141 to the wireless device 100 from the network 220 by end users or potential buyers.

FIG. 4 is a block diagram illustrating the short-range communications subsystem 141 of the wireless device 100 of FIG. 1. The short-range communications subsystem 142 includes a system-on-a-chip ("SOC") module 470 coupled to a front-end module 480. The SOC module 470 includes a Wi-Fi or WLAN radio 411 (i.e., including a Wi-Fi or WLAN transmitter and a Wi-Fi or WLAN receiver 413) for supporting wireless communications between the wireless device 100 and other devices (e.g., laptop computers 440, tablet computers 450, etc.) over a WLAN 410. The WLAN 410 may include one or more access points ("APs") 490, etc. The SOC module 470 also includes a Bluetooth radio 421 (i.e., including a Bluetooth transmitter 423 and a Bluetooth receiver) for supporting wireless communications between the wireless device 100 and other devices (e.g., laptop computers 440, tablet computers 450, etc.) over a Bluetooth network 420. The Bluetooth radio 421 is coupled to a Bluetooth antenna 422 for transmitting and receiving Bluetooth signals. The WLAN radio 411 is coupled to a WLAN antenna 412 for transmitting and receiving WLAN signals via the front-end module 480. The front end module 480 includes a power amplifier 483 in the WLAN TX signal path 481 for amplifying transmitted WLAN signals while the SOC module 470 includes a low noise amplifier 471 in the WLAN RX signal path 482 for amplifying received WLAN signals before they are input to the analog-to-digital converter ("ADC") 472. According to one embodiment, the low noise amplifier 471 may be located external to the SOC module 470. A switch 484 in the front end module 480 is used to selectively couple the TX and RX signal paths 481, 482 to the WLAN antenna 412. The output level of the low noise amplifier 471 is adjusted to perform automatic gain control ("AGC") in accordance with the method described below to regulate the received signal strength at the input of the ADC 472.

As mentioned above, one problem with current wireless devices pertains to simultaneous WLAN and Bluetooth communications. During such communications, interference may arise between WLAN signal RX and Bluetooth signal (e.g., voice) TX. One key metric of WLAN receiver 413 performance is AGC which is used to regulate the received signal strength at the input of the ADC 472 such that the required signal-to-noise ratio ("SNR") for proper decoding is met. In the presence of strong ACI, better performance is obtained by reducing the level of AGC. This however has the effect of reducing WLAN receiver 413 sensitivity, that is, only WLAN frames with higher SNR values will be decoded correctly. This trade-off is not present in the absence of ACI and maintaining AGC at a high value is recommended for improved WLAN receiver 413 performance.

Now, Bluetooth transmits voice signals (for example) over session connection oriented ("SCO") duplex links. SCO activity is periodic and, in its most common version, occurs every 3.75 ms and lasts for 1.25 ms. 625 µs of the Bluetooth cycle is attributed to RX and the other 625 µs is attributed to TX. To correctly receive WLAN beacon/probe response frames (i.e., WLAN discovery frames) without having to deal with AGC (due to ACI), the entire WLAN frame must completely fall between Bluetooth TX activity (i.e., a period of 3.125 ms). Even though this duration is almost twice the length of a legacy WLAN beacon there are two problems. First, the probability of the WLAN discovery frames occurring at the beginning of this window is very small. Statistically, the beacon will occur at the midpoint only 50% of the time leaving only 1.56 ms to completely receive the WLAN discovery frames. Second, in an enterprise environment with multiple virtual local area networks ("VLANs")/service set identifiers ("SSIDs") per beacon, the WLAN beacon is significantly increased in size (e.g., as large as 10 ms) in addition to the continuously growing number of information elements tagged at the end of the WLAN beacon. Both of these factors imply that simultaneous Bluetooth TX and WLAN RX operation is required to support simultaneous Bluetooth voice and WLAN discovery operation. This requires reducing AGC. While the reduced sensitivity associated with reduced levels of AGC will be offset in dense enterprise wide WLAN deployments with high SNR values at the scanning clients, however, in residential single AP 490 deployments (for example), reducing the AGC may imply undetected APs 490 or lost links due to missed WLAN beacons.

For reference, an AP 490 in a WLAN 410 periodically sends a "beacon frame" to announce its presence and relay information, such as timestamp, SSID, and other parameters regarding the AP 490 to WLAN devices (e.g., 100, 411) that are within range. WLAN devices 100, 411 continually scan all WLAN radio channels and listen to beacons as the basis for choosing which AP 490 is best to associate with. A WLAN device 100, 411 sends a "probe request frame" when it needs to obtain information from another device. For example, a WLAN device 100, 411 would send a probe request to determine which APs 490 are within range. And, a WLAN device (e.g., 100, 411, 490) will respond with a "probe response frame", containing capability information, supported data rates, etc., after it receives a probe request frame.

The present application provides a dynamic AGC method that takes the environment and beacon duration into consideration before adjusting the level of AGC to be used.

Figure 5:
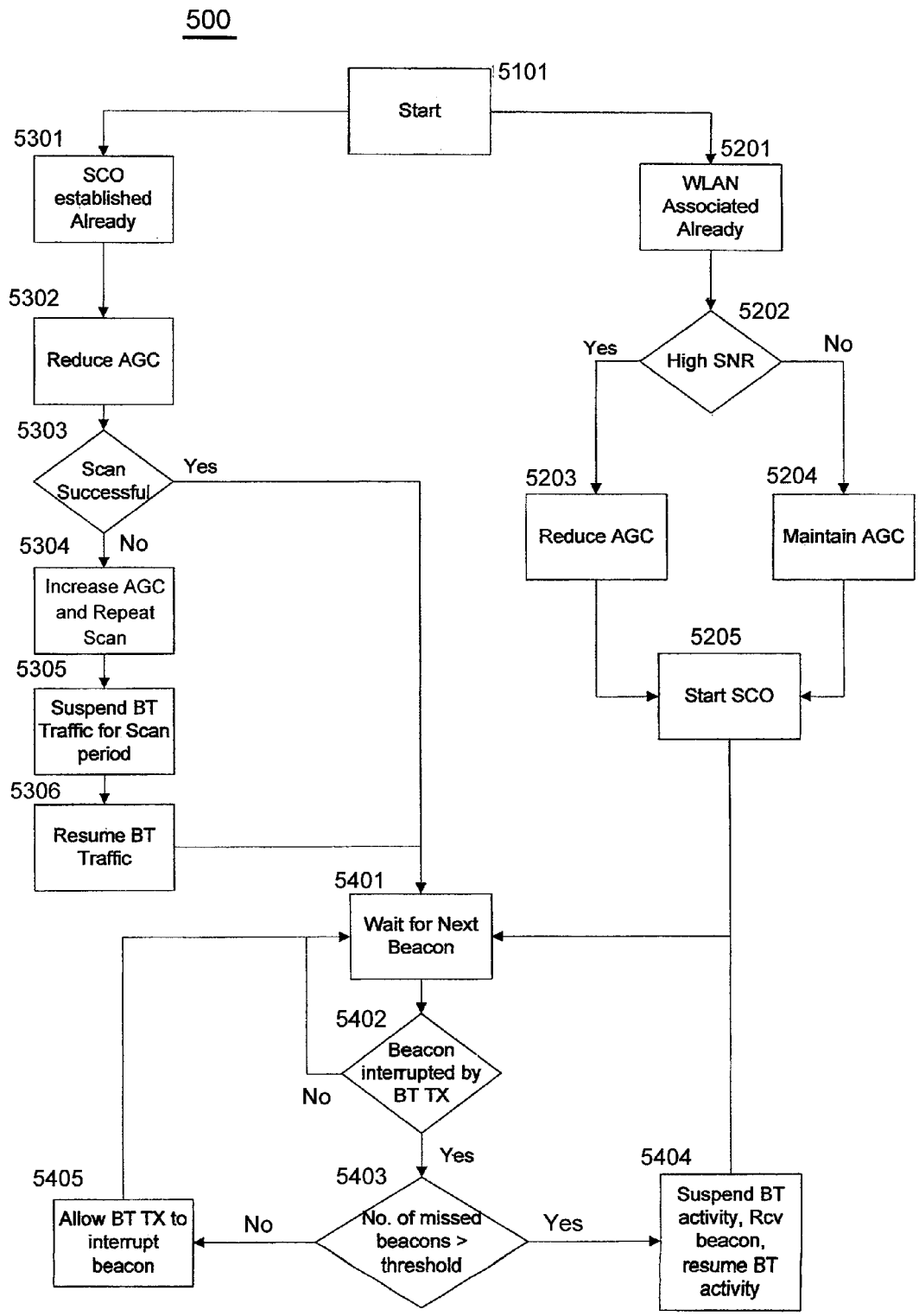

FIG. 5 is a flow chart illustrating operations 500 of modules 206 within the memory 200 of a wireless device 100 for adjusting automatic gain control in the WLAN receiver 411 of the wireless device 100 during simultaneous WLAN and Bluetooth communications, in accordance with an embodiment of the application.

At step 5101, the operations 500 start. Two possible paths 5201, 5301 are available depending on which radio 411, 421 is already active. In the first path 5201, the WLAN radio 411 is active. In the second path 5301, the Bluetooth SCO session is active for the Bluetooth radio 421.

At step 5201, the WLAN radio 411 is already associated with, for example, an AP 490.

At step 5202, a determination is made as to the type of environment the WLAN radio 411 is operating in by measuring the SNR of received WLAN signals. The objective here is to determine if the WLAN SNR is high enough such that even if the AGC level is reduced, the beacons/probe responses (e.g., from APs 490) can still be received.

At step 5203, if the SNR is above a predetermined threshold (e.g., −65 dBm), the AGC level is reduced.

At step 5204, if the SNR is below the predetermined threshold, the AGC level is maintained.

At step 5205, the Bluetooth SCO session is started after the AGC has been adjusted at steps 5203 or 5204. At the end of this step, both radios 411, 421 have active sessions and are operating in parallel or simultaneously. Operations of the WLAN radio 411 proceed to step 5401 where it continues to receive beacons as part of WLAN link maintenance.

At step 5301, the Bluetooth radio's SCO session is already active.

At step 5302, being conservative with respect to dropping Bluetooth packets, the AGC level is reduced. This improves the detection of WLAN beacons.

At step 5303, a scan for APs 490 is performed by the WLAN radio 411. The scan will be successful in an environment with strong WLAN SNR and, if so, operations proceed to step 5401. In this case, the duration of the beacon does not affect the scan success probability since simultaneous Bluetooth TX and WLAN RX is possible.

At step 5304, if the scan of step 5303 was not successful, then the only possibility remaining is the availability of an undetected AP 490 at a low received signal strength indication ("RSSI") value (e.g., −80 dBm). To rule out this possibility, the AGC level is increased to the normal level (e.g., its level before it was reduced at step 5302) and the scan is repeated.

At step 5305, noting that it is likely that the WLAN beacon/probe response will overlap the Bluetooth TX (i.e., the beacon/probe response will not be decoded correctly) or will actually occur during a Bluetooth TX in which case it will be missed completely, Bluetooth traffic is suspended for the duration of the one time scan of step 5304 (which should last on the order of approximately 1 inter-beacon arrive time times the number of scanned frequencies (e.g., 3×102.4 ms)) to prevent this from occurring. To prevent such a long audio outage, the scan interval may be spread over a longer period of time.

At step 5306, Bluetooth traffic is resumed after the WLAN scan of step 5304 is completed. If an AP 490 is found or not, operations move to the link maintenance step 5401. For reference, link maintenance refers to the need for an existing or newly established WLAN connection to continue receiving beacons to ensure connectivity to the AP 490 and prevent termination.

At step 5401, operations wait until the next beacon. This branch of the operations 500 pertains to link maintenance. This branch only pertains to those cases where the AGC level was not reduced since simultaneous Bluetooth TX and WLAN RX is not possible.

At step 5402, a determination is made as to whether the beacon/probe response is going to last longer than the beginning of the Bluetooth TX period. That is, whether the WLAN beacon is likely to be interrupted by a Bluetooth TX. This may be readily determined as Bluetooth TX activity is highly periodic (i.e., typically 3.75 ms between transmission periods). Typically, cases with low SNR values (i.e., requiring high AGC) correspond to a single AP 490 deployment with short beacons (e.g., residential deployments with no VLANs/SSIDs and a limited number of information elements). This implies that the probability of fully receiving a WLAN beacon/probe response in between Bluetooth TX activity is high. If the WLAN beacon is likely to be interrupted, operations proceed to step 5403. If the WLAN beacon is not likely to be interrupted, operations return to step 5401.

At step 5403, a determination is made as to whether the number of missed beacons exceeds a threshold (e.g., 10). If the number of missed beacons exceeds the threshold, operations proceed to step 5404. Otherwise, operations proceed to step 5405.

At step 5404, if multiple beacons/probes are missed, to prevent link termination due to missed beacons, Bluetooth TX activity is suspended until a beacon is received. When a beacon is received, operations proceed to step 5401.

At step 5405, if multiple beacons/probes are not missed, Bluetooth TX is allowed to interrupt the beacon and operations proceed to step 5401. This will also address the event where the beacons begin during a Bluetooth TX (i.e., step 5404).

Thus, to reiterate, according to one embodiment of the application there is provided a method for adjusting a gain level for a receiver 413 of a first radio (e.g., a wireless local area network ("WLAN") radio) 411 simultaneously operational with a transmitter 423 of a second radio (e.g., a Bluetooth radio) 421, comprising: determining a signal-to-noise ratio ("SNR") value for signals (e.g., WLAN signals) received by the receiver 413 from an access point ("AP") 490; and, when the first radio 411 is associated with the AP 490 and the transmitter 423 is not transmitting, if the SNR value exceeds a SNR threshold, reducing the gain level for the receiver 413 from an initial level and initiating transmission from the transmitter 423, otherwise maintaining the gain level for the receiver 413 at the initial level and initiating transmission from the transmitter 423; wherein the SNR threshold is a SNR value above which beacon signals (e.g., WLAN beacon signals) from the AP 490 can be successfully received by the receiver 413.

The above method may further include, when the first radio 411 is not associated with the AP 490 and the transmitter 423 is transmitting, reducing the gain level for the receiver 413 from the initial level and scanning for the beacon signals from the AP 490 and, if the scanning is not successful, increasing the gain level to the initial level, suspending transmission from the transmitter 423, re-scanning for the beacon signals from the AP 490, and resuming transmission from the transmitter 423. The method may further include, when the first radio 411 is associated with the AP 490 and the transmitter 423 is transmitting, determining a number of missed beacon signals (e.g., a number of missed WLAN beacon signals) and, if the number of missed beacon signals exceeds a missed beacon signals threshold (e.g., a missed WLAN beacon signals threshold), suspending transmission from the transmitter 423, scanning for the beacon signals from the AP 490, receiving a beacon signal (e.g., a WLAN beacon signal) from the AP 490, and resuming transmission from the transmitter 423. The transmission from the transmitter 423 may be suspended for one scan period. The re-scanning may be for one scan period.

The gain level may be an automatic gain control ("AGC") level. The first radio 411 and the second radio 421 may be deployed in a single wireless device 100. The signals (e.g., WLAN signals) may be beacon signals (e.g., WLAN beacon signals). The beacon signals (e.g., WLAN beacon signals) may include probe response signals (e.g., WLAN probe response signals). The SNR threshold may be −65 dBm and the missed beacon signals threshold (e.g., the missed WLAN beacon signals threshold) may be 10. And, the first radio 411 may be a wireless local area network ("WLAN") radio, the second radio 421 may be a Bluetooth radio, the signals may be WLAN signals, and the beacon signals may be WLAN beacon signals.

The above embodiments may contribute to an improved method and system for adjusting automatic gain control in the WLAN receiver 413 of a wireless device 100 during simultaneous WLAN and Bluetooth communications and may provide one or more advantages. For example, the use of the WLAN SNR to adjust the level of AGC within the WLAN receiver 413 allows for more efficient use of both the WLAN and Bluetooth radios 411, 421.

The above described method is generally performed by a wireless device 100. However, according to one example embodiment, the method can be performed by any other data processing system 100 such as a personal computer ("PC"), server, laptop computer, etc.

While example embodiments of this application are primarily discussed as a method, a person of ordinary skill in the art will understand that the apparatus discussed above with reference to a wireless device 100 and a data processing system, may be programmed to enable the practice of the method of these example embodiments. Moreover, an article of manufacture or product for use with a wireless device 100 or data processing system, such as a pre-recorded storage device or other similar computer readable medium or product including program instructions recorded thereon, may direct the wireless device 100 or data processing system to facilitate the practice of the method of these example embodiments. It is understood that such apparatus, products, and articles of manufacture also come within the scope of the application.

The embodiments of the application described above are intended to be exemplary only. Those skilled in this art will understand that various modifications of detail may be made to these embodiments, all of which come within the scope of the application.

What is claimed is:

1. A method for adjusting a gain level for a receiver of a first radio simultaneously operational with a transmitter of a second radio, comprising:
    determining a signal-to-noise ratio ("SNR") value for signals received by the receiver from an access point ("AP"); and
    when the first radio is associated with the AP and the transmitter is not transmitting,
        when the SNR value exceeds a SNR threshold, reducing the gain level for the receiver from an initial level;
        when the SNR value is below the SNR threshold, maintaining the gain level for the receiver at the initial level; and
        initiating transmission from the transmitter,
    wherein the SNR threshold is a SNR value above which beacon signals from the AP can be successfully received by the receiver.

2. The method of claim 1 and further comprising:
    when the first radio is not associated with the AP and the transmitter is transmitting reducing the gain level for the receiver from the initial level;
scanning for the beacon signals from the AP; and
when the scanning is not successful,
increasing the gain level to the initial level;
suspending transmission from the transmitter;
re-scanning for the beacon signals from the AP; and
resuming transmission from the transmitter.

3. The method of claim 2 and further comprising:
when the first radio is associated with the AP and the transmitter is transmitting
determining a number of missed beacon signals; and
when the number of missed beacon signals exceeds a missed beacon signals threshold
suspending transmission from the transmitter;
scanning for the beacon signals from the AP;
receiving a beacon signal from the AP; and
resuming transmission from the transmitter.

4. The method of claim 2 wherein the transmission from the transmitter is suspended for one scan period.

5. The method of claim 2 wherein the re-scanning is for one scan period.

6. The method of claim 1 wherein the gain level is an automatic gain control ("AGC") level.

7. The method of claim 1 wherein the first radio and the second radio are deployed in a single wireless device.

8. The method of claim 1 wherein the signals are beacon signals.

9. The method of claim 1 wherein the beacon signals include probe response signals.

10. The method of claim 3 wherein the SNR threshold is −65 dBm and the missed beacon signals threshold is 10.

11. The method of claim 1 wherein the first radio is a wireless local area network ("WLAN") radio, wherein the second radio is a Bluetooth radio, wherein the signals are WLAN signals, and wherein the beacon signals are WLAN beacon signals.

12. A system for adjusting a gain level for a receiver of a first radio simultaneously operational with a transmitter of a second radio, comprising:
a processor coupled to memory; and
at least one of hardware and software modules within the memory and controlled or executed by the processor, the modules including:
a module for determining a signal-to-noise ratio ("SNR") value for signals received by the receiver from an access point ("AP"); and
a module for controlling initiation of the transmitter when the first radio is associated with the AP and the transmitter is not transmitting, by
when the SNR value exceeds a SNR threshold, reducing the gain level for the receiver from an initial level;
when the SNR value is below the SNR threshold, maintaining the gain level for the receiver at the initial level; and
initiating transmission from the transmitter,
wherein the SNR threshold is a SNR value above which beacon signals from the AP can be successfully received by the receiver.

13. The system of claim 12 and further comprising:
a module for controlling the transmitter when the first radio is not associated with the AP and the transmitter is transmitting by
reducing the gain level for the receiver from the initial level;
scanning for the beacon signals from the AP; and
when the scanning is not successful,
increasing the gain level to the initial level;
suspending transmission from the transmitter;
re-scanning for the beacon signals from the AP; and
resuming transmission from the transmitter.

14. The system of claim 13 and further comprising:
a module for controlling the transmitter when the first radio is associated with the AP and the transmitter is transmitting by
determining a number of missed beacon signals; and
when the number of missed beacon signals exceeds a missed beacon signals threshold
suspending transmission from the transmitter;
scanning for the beacon signals from the AP;
receiving a beacon signal from the AP; and
resuming transmission from the transmitter.

15. The system of claim 13 wherein the transmission from the transmitter is suspended for one scan period.

16. The system of claim 13 wherein the re-scanning is for one scan period.

17. The system of claim 12 wherein the gain level is an automatic gain control ("AGC") level.

18. The system of claim 12 wherein the first radio and the second radio are deployed in a single wireless device.

19. The system of claim 12 wherein the signals are beacon signals.

20. The system of claim 12 wherein the beacon signals include probe response signals.

21. The system of claim 14 wherein the SNR threshold is −65 dBm and the missed beacon signals threshold is 10.

22. The system of claim 12 wherein the first radio is a wireless local area network ("WLAN") radio, wherein the second radio is a Bluetooth radio, wherein the signals are WLAN signals, and wherein the beacon signals are WLAN beacon signals.

* * * * *